United States Patent
Stocken et al.

(10) Patent No.: US 7,251,758 B2
(45) Date of Patent: Jul. 31, 2007

(54) SEMICONDUCTOR DEVICE TESTING APPARATUS, SYSTEM, AND METHOD FOR TESTING THE CONTACTING WITH SEMICONDUCTOR DEVICES POSITIONED ONE UPON THE OTHER

(75) Inventors: Christian Stocken, München (DE); Manfred Dobler, München (DE)

(73) Assignee: Infineon Technologies AG, Munich (DE)

(*) Notice: Subject to any disclaimer, the term of this patent is extended or adjusted under 35 U.S.C. 154(b) by 512 days.

(21) Appl. No.: 10/738,118

(22) Filed: Dec. 18, 2003

(65) Prior Publication Data

US 2004/0196022 A1    Oct. 7, 2004

(30) Foreign Application Priority Data

Dec. 18, 2002   (DE) ............................... 102 59 300

(51) Int. Cl.
    *G11C 29/00*    (2006.01)
(52) U.S. Cl. ...................................... 714/718
(58) Field of Classification Search ............... 714/718, 714/719, 733, 734, 738
    See application file for complete search history.

(56) References Cited

U.S. PATENT DOCUMENTS

| | | | | |
|---|---|---|---|---|
| 5,428,624 A | * | 6/1995 | Blair et al. ................. | 714/727 |
| 5,841,785 A | * | 11/1998 | Suzuki ........................ | 714/718 |
| 5,956,233 A | * | 9/1999 | Yew et al. .................. | 361/760 |
| 5,956,280 A | | 9/1999 | Lawrence | |
| 6,345,372 B1 | | 2/2002 | Dieckmann et al. | |
| 6,668,347 B1 | * | 12/2003 | Babella et al. .............. | 714/733 |
| 6,993,692 B2 | * | 1/2006 | Ouellette et al. ........... | 714/723 |

* cited by examiner

*Primary Examiner*—James C Kerveros
(74) *Attorney, Agent, or Firm*—Slater & Matsil, L.L.P.

(57) ABSTRACT

A semiconductor device testing apparatus, system, and method, in particular for testing the contacting with semiconductor devices positioned one upon the other, wherein at least two semiconductor devices are provided that are connected to a device module, at least one pin of a first semiconductor device is conductively connected with a pad, and at least one pin of a second semiconductor device also is to conductively connected with the pad. A first value is written into a memory cell of the first semiconductor device, a second value differing from the first value is written into a memory cell of the second semiconductor device, and a signal corresponding to the first value at the pin of the first semiconductor device and of a signal corresponding to the second value at the pin of the second semiconductor device is simultaneously output.

12 Claims, 5 Drawing Sheets

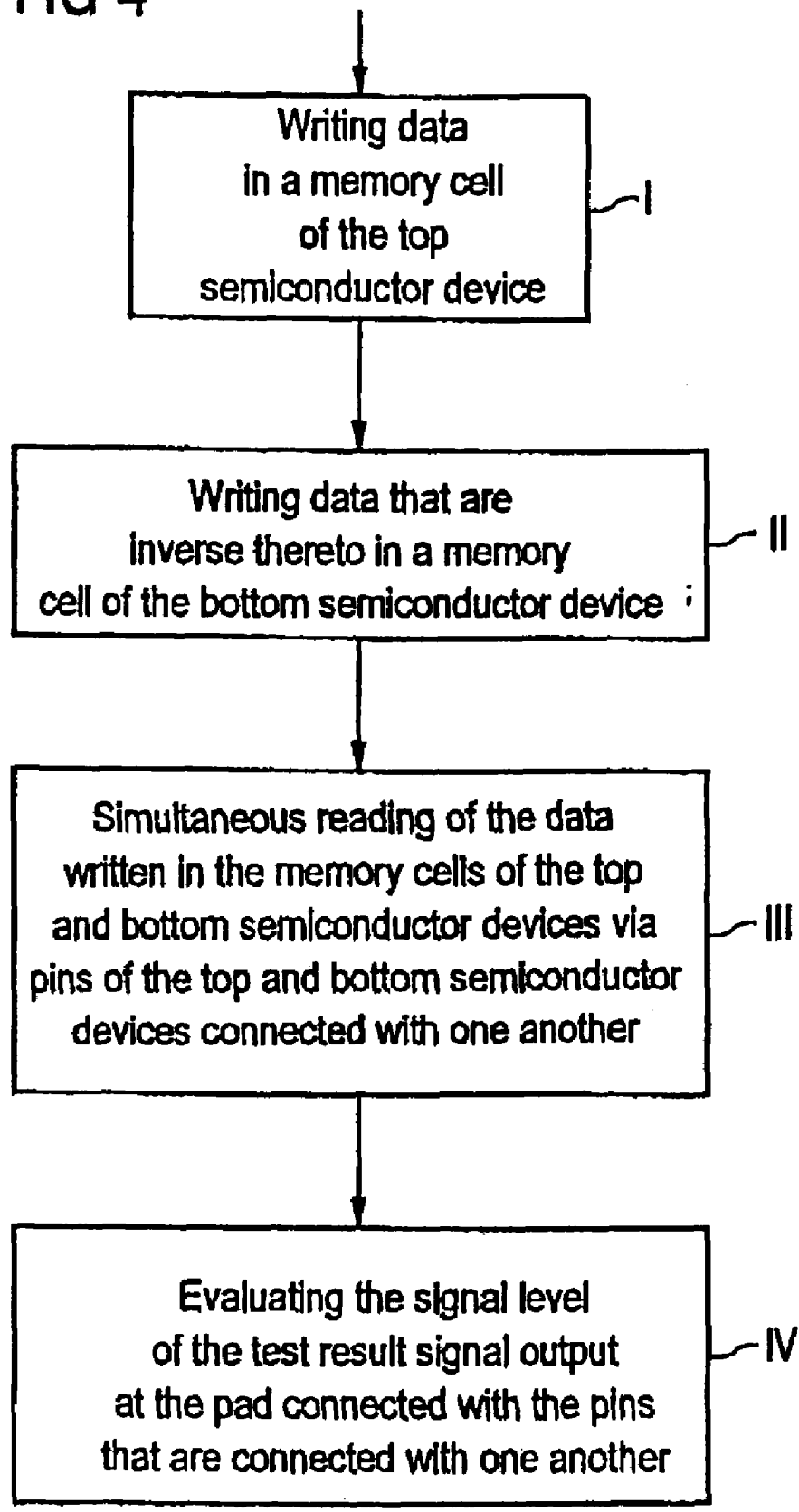

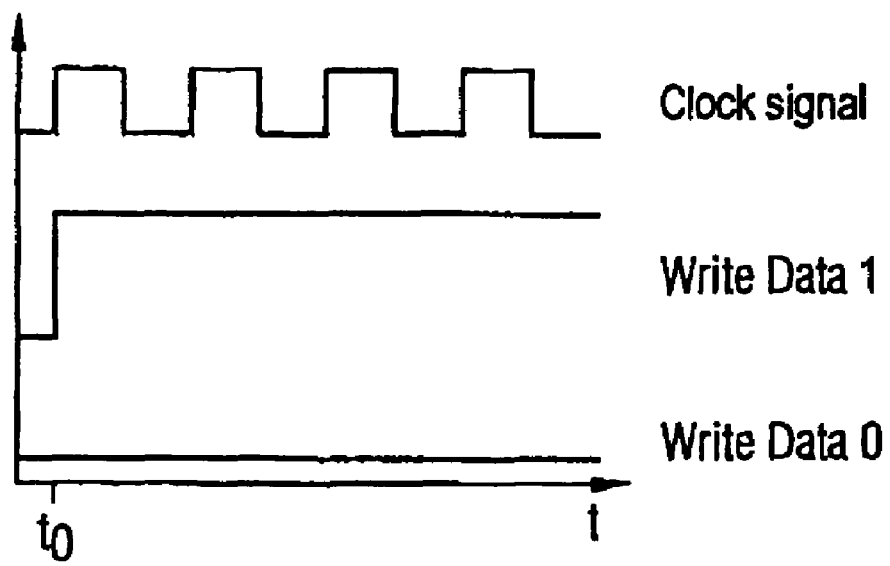
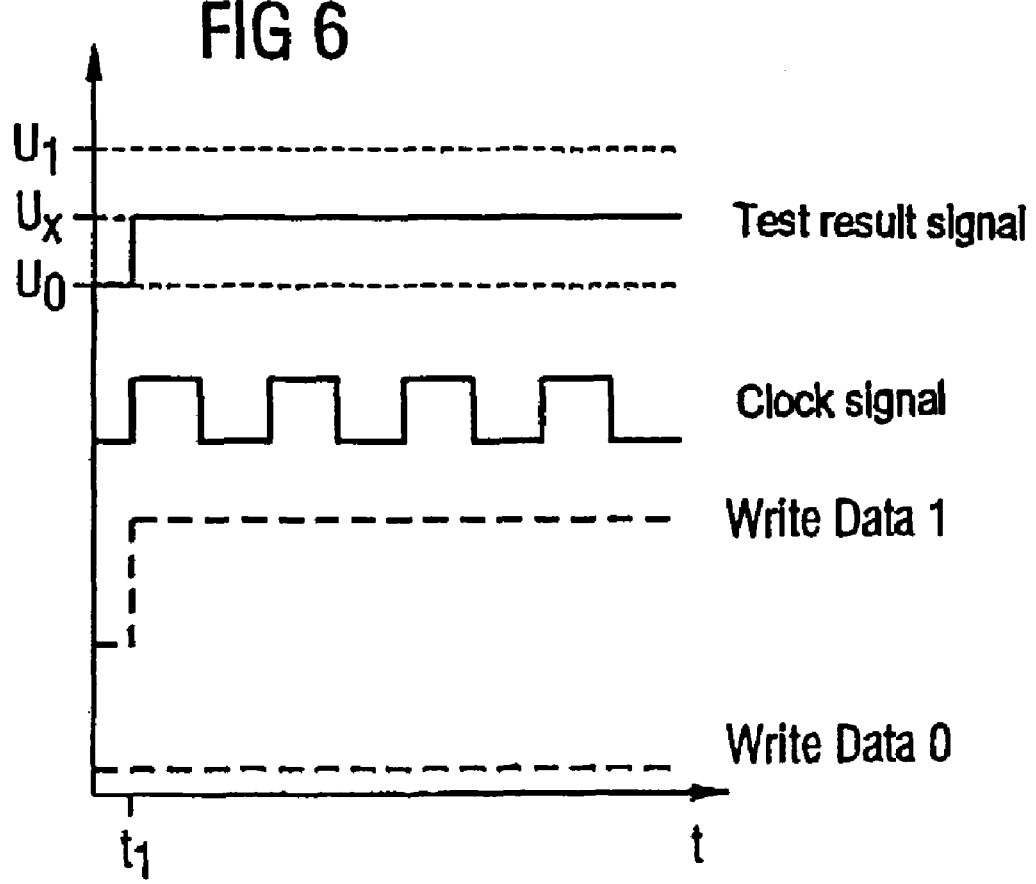

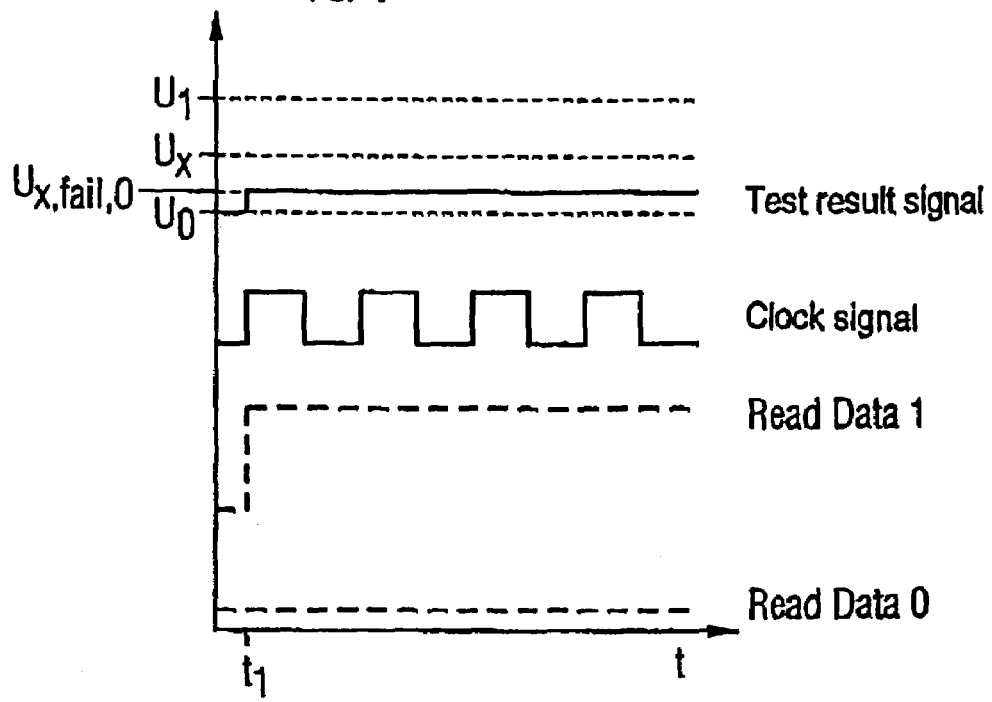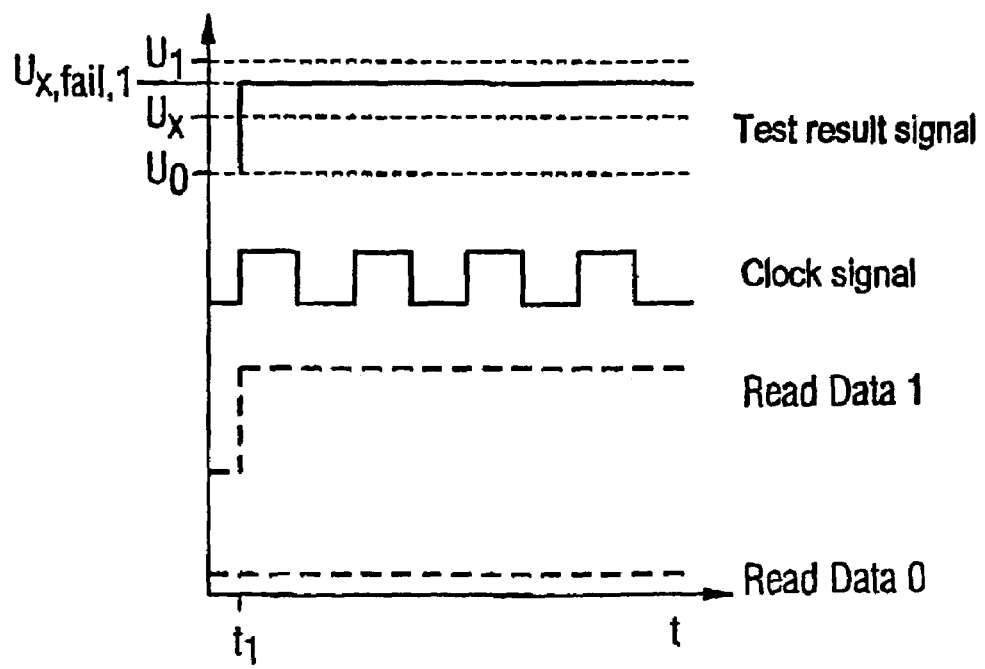

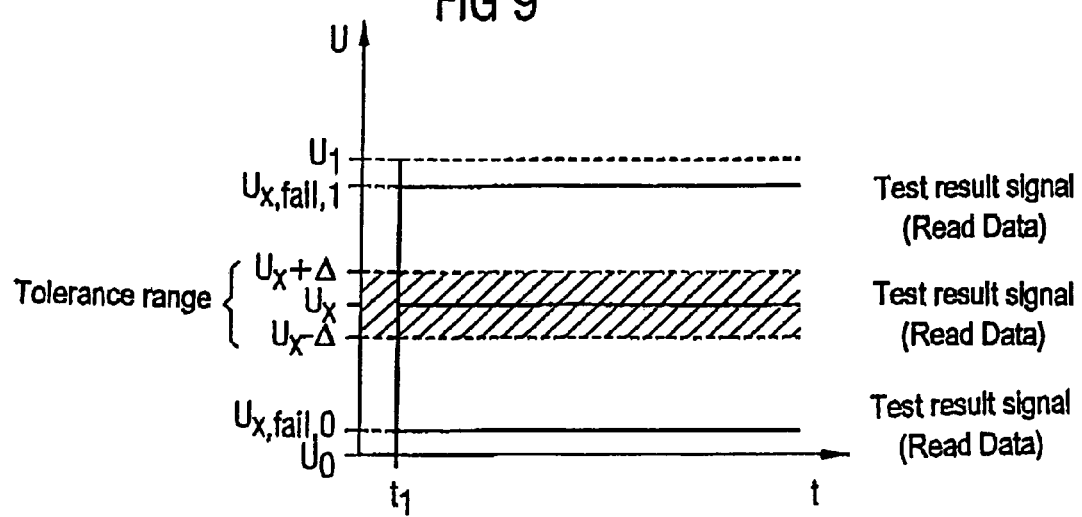

SEMICONDUCTOR DEVICE TESTING APPARATUS, SYSTEM, AND METHOD FOR TESTING THE CONTACTING WITH SEMICONDUCTOR DEVICES POSITIONED ONE UPON THE OTHER

CLAIM FOR PRIORITY

This application claims the benefit of priority to German Application No. 102 59 300.0, filed in the German language on Dec. 18, 2002, the contents of which are hereby incorporated by reference.

TECHNICAL FIELD OF THE INVENTION

The invention relates to a semiconductor device testing apparatus, system, and method, in particular for testing the contacting with semiconductor devices positioned one upon the other.

BACKGROUND OF THE INVENTION

Semiconductor devices, e.g. appropriate, integrated (analog or digital) computing circuits, semiconductor memory devices such as functional memory devices (PLAs, PALs, etc.) and table memory devices (e.g. ROMs or RAMs, in particular SRAMs and DRAMs), etc. are subject to comprehensive tests in the course of the manufacturing process, e.g. in the semi-finished and/or finished condition, before and/or after being installed in corresponding device modules, etc.

After the installing of a corresponding semiconductor device, e.g. a SRAM or a DRAM (e.g. a DRAM with double data rate (DDR-DRAM=Double Data Rate DRAM), in particular a High-Speed DRAM) in a corresponding device module—in particular after the soldering of the pins of the semiconductor device with the corresponding module pads—it can be tested by means of an appropriate testing apparatus whether the pins of the semiconductor device are safely contacting the corresponding module pads.

In the case of conventional semiconductor devices, the pins are connected internally in the device in general to one or a plurality of protective devices each comprising one or a plurality of diodes (e.g. an ESD structure comprising one or a plurality of diodes each connected e.g. to the supply voltage and/or ground connection).

When relatively high voltages are applied to the pins, the diodes become conductive, and the pins are then connected with the corresponding voltage or ground connection, respectively, in a correspondingly low-resistance manner.

This avoids, during the applying of high voltages, having too high currents flowing in further devices of the semiconductor device connected with the pins (this avoiding a destruction of the further devices).

When, as explained above, it is to be tested whether a particular pin of the semiconductor device is safely contacting the corresponding module pad, current may be imposed upon the corresponding protection diode by the above-mentioned testing apparatus via the corresponding module pad, whereafter the voltage dropping across the diode is measured, or a corresponding voltage may be applied by the testing apparatus at the module pad, whereafter the current flowing through the diode is measured.

When no or only very little current is flowing, it is detected that no or no sufficiently good contacting between the pin and the module pad exists.

Frequently, a plurality of semiconductor devices are installed in one and the same device module (in general such that the semiconductor devices are positioned side by side in one and the same plane).

In order to increase the number of semiconductor devices that can be installed in a device module, in the case of so-called stacked modules the semiconductor devices are—for reasons of space—arranged, contrary thereto, in different planes, in particular such that e.g. every two (or more, e.g. three or four) semiconductor devices are positioned directly one upon the other (with the result that e.g. 18 instead of only 9 semiconductor devices can be installed in a module of particular size).

All (active) pins of the respective top semiconductor device can be connected to respectively corresponding (active) pins of the respective bottom semiconductor device (e.g. by means of corresponding soldering connections)—apart, for instance, from a pin to be triggered separately (e.g. the Chip Select pin or CS pin, respectively) of the top semiconductor device which can be connected to a non-active pin of the bottom semiconductor device (and vice versa)).

After the installing of the corresponding (stacked) semiconductor devices in the corresponding stacked module—in particular after the soldering of the corresponding pins with the corresponding module pads—it can be tested by means of a method corresponding to the method described above whether the pins of the semiconductor devices are safely contacting the corresponding module pads.

This may, for instance, be achieved by a testing apparatus corresponding to the above-mentioned testing apparatus imposing, via the corresponding module pad, and from there via the corresponding pin of the bottom and of the top semiconductor devices, a current upon the corresponding protection diodes which are connected in parallel and are each connected with the corresponding pin of the top or bottom semiconductor devices, whereafter the voltage dropping across the diodes is measured, or a corresponding voltage can be applied by the testing apparatus at the module pad, whereafter the current flowing through the diodes is measured.

When no or only very little current is flowing, a contacting fault is detected.

This conventional testing method has a series of disadvantages.

With the conventional testing method one can, for instance, not—or only with relatively great effort, in particular with a testing apparatus having a very high measuring resolution—detect that e.g. the pin of the bottom semiconductor device is indeed contacting the corresponding module pad sufficiently well, not, however, the corresponding pin of the top semiconductor device (or vice versa) since a relatively high current may flow through the diode connected with the corresponding sufficiently well-contacted pin.

Neither—or only with relatively high effort—can it be detected with the above-mentioned conventional testing method that a soldering connection does indeed exist between the module pad and the pin, but that it is not of sufficiently good quality (i.e. has too high resistance).

SUMMARY OF THE INVENTION

The invention provides a semiconductor device testing apparatus, a semiconductor device testing system, and a semiconductor device testing method, in particular for testing the contacting with semiconductor devices positioned one upon the other.

In accordance with embodiment of the invention, a semiconductor device testing method is provided, wherein at least two semiconductor devices are provided that are connected to a device module, wherein at least one pin of a first semiconductor device is to be conductively connected with a pad, and wherein at least one pin of a second semiconductor device also is to be conductively connected with said pad, characterized in that the method comprises:

writing of a first value into a memory cell of said first semiconductor device;

writing of a second value differing from the first value into a memory cell of the second semiconductor device;

simultaneous outputting of a signal corresponding to the first value at the pin of the first semiconductor device and a signal corresponding to the second value at the pin of the second semiconductor device.

Advantageously, the first and second values are complementary digital values, or the signals output at the pin of the first semiconductor device and at the pin of the second semiconductor device are complementary to each other, respectively.

At the pin of the first semiconductor device and at the pin of the second semiconductor device, instead of signals corresponding to the respective first and second values, signals complementary thereto may, for instance, also be output (so that the two signals output are again complementary to one another), or one and the same value may, for instance, be written into the memory cells of the semiconductor devices, but the signal output at the pin of the first (or second) semiconductor device may be complementary to the value written into the corresponding memory cell (so that—again—the signals output at the pin of the first semiconductor device and at the pin of the second semiconductor device are complementary to one another).

Preferably, the method additionally comprises the following: evaluating of a signal available at the above-mentioned pad or at a line connected therewith, respectively.

When the signal lies below or above a predetermined threshold value, a contacting fault exists.

BRIEF DESCRIPTION OF THE DRAWINGS

In the following, the invention will be explained in detail by means of embodiments and the enclosed drawing. The drawing shows:

FIG. 4 shows a flowchart for illustrating the method performed for testing the semiconductor devices in accordance with the embodiment.

FIG. 5 shows a representation of the signals occurring during writing of the data on the memory cells of the semiconductor devices illustrated in FIG. 3.

FIG. 6 shows a representation of the signals occurring during reading of the data written on the memory cells of the semiconductor devices illustrated in FIG. 3 with sufficiently good contacting.

FIG. 7 shows a representation of the signals occurring during reading of the data written on the memory cells of the semiconductor devices illustrated in FIG. 3 with faulty contacting by the top semiconductor device.

FIG. 8 shows a representation of the signals occurring during reading of the data written on the memory cells of the semiconductor devices illustrated in FIG. 3 with faulty contacting by the bottom semiconductor device.

FIG. 9 shows a representation of possible signals occurring during reading of the data written on the memory cells of the semiconductor devices illustrated in FIG. 3, and of a signal level tolerance range used with the testing method for differentiating between sufficiently good and faulty contacting.

DETAILED DESCRIPTION OF THE INVENTION

Figure 1:
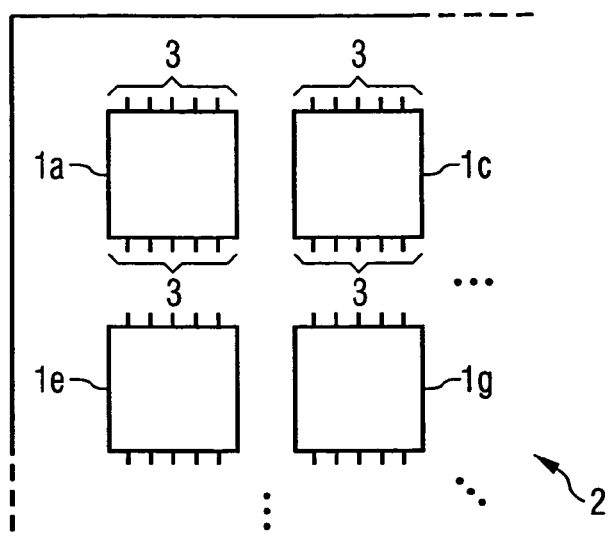
FIG. 1 shows a top representation of a section of the device module comprising a plurality of semiconductor devices positioned one upon the other to be tested.

FIG. 1 shows—viewed from the top—a section of a device module 2, e.g. a circuit board 2.

A plurality of, e.g. more than three or five, in particular e.g. nine or eighteen, semiconductor devices 1a, 1b, 1c, 1d, 1e, 1f, 1g are connected to the device module 2 (cf. e.g. the semiconductor devices 1a, 1c, 1e, 1g positioned side by side, as illustrated in FIG. 1).

The semiconductor devices 1a, 1b, 1c, 1d, 1e, 1f, 1g may, for instance, be appropriate, integrated (analog or digital) computing circuits, or semiconductor memory devices such as functional memory devices (PLAs, PALs, etc.) or table memory devices (e.g. ROMs or RAMs), in particular SRAMs or DRAMs (here e.g. DRAMs (Dynamic Random Access Memories or dynamic read-write memories, respectively) with double data rate (DDR-DRAMs=Double Data Rate DRAMs), advantageously High-Speed DDR-DRAMs).

Each semiconductor device 1a, 1b, 1c, 1d, 1e, 1f, 1g comprises a plurality of pins 3 which are—as will be explained in detail further below—connected to corresponding pads 4a, 4b, 4c, 4d of the device module 2 (e.g. by means of corresponding soldering and/or plug connections), and thus to corresponding lines provided on the semiconductor module 2 (not illustrated), in particular to corresponding circuit paths of a bus system.

Figure 2:
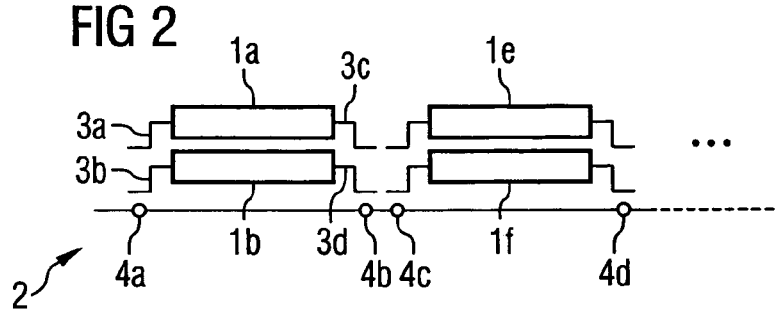
FIG. 2 shows a side representation of the device module section illustrated in FIG. 1.

As results e.g. from FIG. 2, the device module 2 is a so-called stacked module.

In the case of a stacked module (and correspondingly also with the device module 2 illustrated in FIGS. 1 and 2)—in order to increase the number of semiconductor devices 1a, 1b, 1c, 1d, 1e, 1f, 1g that can be connected to the device module 2—a plurality of (here e.g. two, alternatively e.g. three or four) semiconductor devices 1a, 1b, 1c, 1d, 1e, 1f, 1g each are positioned in different planes and directly one upon the other (here e.g. the semiconductor device 1a upon the semiconductor device 1b, the semiconductor device 1e upon the semiconductor device 1f, etc.).

A plurality of the semiconductor devices 1a, 1b, 1c, 1d, 1e, 1f, 1g provided on the device module 2 (in particular a plurality of semiconductor devices 1a, 1b, 1c, 1d, 1e, 1f, 1g positioned side by side and/or—in particular—a plurality of semiconductor devices positioned one upon the other or one below the other) each may be of substantially identical structure, design, and equipment, and may have the same (or substantially the same) number of pins 3.

The semiconductor devices 1a, 1b or 1e, 1f, etc. positioned directly one upon the other are designed such that a plurality of, in particular all, individual pins 3a, 3c of the respective top semiconductor devices 1a or 1e, respectively, each are positioned close to respectively corresponding individual pins 3b, 3d of the respective bottom semiconductor devices 1*b* or 1*f*, respectively (or directly above the corresponding individual pins 3*b*, 3*d*), or touch same.

All (active) individual pins 3*a*, 3*c* of the respective top semiconductor device 1*a* or 1*e*, respectively are (e.g. by means of corresponding soldering and/or plug connections) connected to respectively corresponding (active) individual pins 3*b*, 3*d* of the respective bottom semiconductor device 1*b* or 1*f*, respectively—apart, for instance, from one or a plurality of individual pins to be triggered separately (e.g. the Chip Select pin or CS pin, respectively) of the top semiconductor devices 1*a* or 1*e*, respectively, which may be connected to a non-active pin of the bottom semiconductor devices 1*b* or 1*f*, respectively (and vice versa).

The individual pins 3*b* or 3*d*, respectively, of the respective bottom semiconductor devices 1*b* or 1*f*, respectively (and thus also the individual pins 3*a* or 3*c*, respectively, of the respective top semiconductor devices 1*a* or 1*e*, respectively) are connected to the above-mentioned respectively assigned pads 4*a*, 4*b*, 4*c*, 4*d* of the device module 2—especially one respective particular individual pin 3*b* to one respective assigned pad 4*a* (e.g. by means of the above-mentioned, or by means of further soldering and/or plug connections). Alternatively, the respective individual pins 3*a* or 3*c*, respectively, of the respective top semiconductor devices 1*a* or 1*e*, respectively, may, for instance, also be connected to separate pads that are connected with the above-mentioned pads 4*a*, 4*b*, 4*c*, 4*d*.

Figure 3:
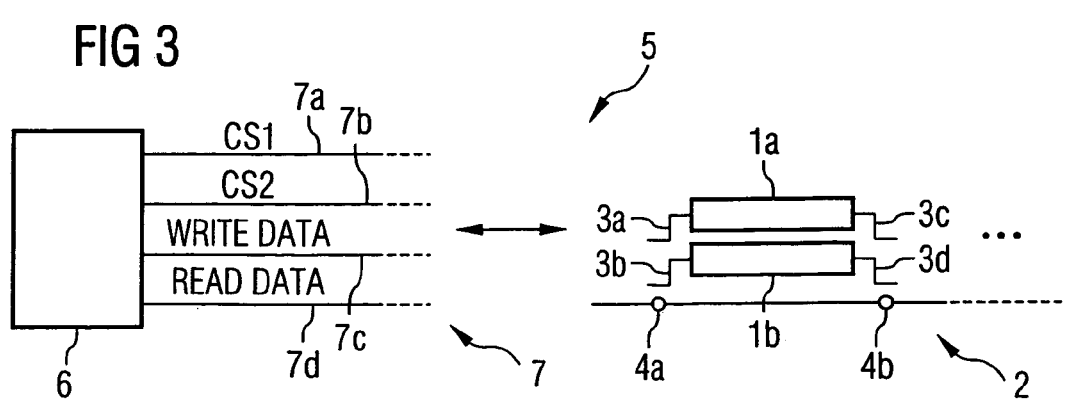
FIG. 3 shows a representation of the basic structure of a semiconductor device testing system used in accordance with an embodiment of the present invention for testing the semiconductor devices.

FIG. 3 is a schematic representation of the basic structure of a semiconductor device testing system 5 used for testing the semiconductor devices 1*a*, 1*b* connected to the device module 2 in accordance with an embodiment of the present invention.

This system comprises a testing apparatus 6 having a structure correspondingly similar to that of conventional testing apparatuses and being connected to the device module 2 via a plurality of lines 7.

By means of the testing system 5 or by means of the testing method performed by the testing apparatus 6, respectively, it can—as will be explained more exactly in the following—be detected separately for each individual pin 3*a*, 3*c* or 3*b*, 3*d*, respectively, of each semiconductor device (and separately for the top semiconductor devices 1*a*, 1*e* and for the bottom semiconductor devices 1*b*, 1*f*) whether the pin is safely contacting the respectively assigned module pad 4*a*, 4*b*.

To this end, the testing apparatus 6 first of all addresses, for instance, a top semiconductor device 1*a* (or alternatively e.g. first of all a bottom semiconductor device 1*b*) by a chip select signal CS1 being, for instance, output via a first line 7*a* (here: a first chip select line 7*a*) that is connected with the testing apparatus 6, and being transferred, by means of a corresponding line on the device module 2 connected with the line 7*a*, and a corresponding module pad to the above-mentioned chip select pin of the top semiconductor device 1*a*.

Subsequently—in a correspondingly conventional manner, and caused by the testing apparatus 6—a corresponding, in particular digital value (e.g. "1" (or "0")) is written into a corresponding memory cell provided in the top semiconductor device 1*a*, for instance, by a corresponding signal, e.g. a logically high signal (or alternatively: a logically low signal (WRITE DATA signal)) being output via a data write line 7*c* that is connected with the testing apparatus 6, and being transferred, via a corresponding line on the device module 2 connected with the line 7*c*, and a corresponding module pad to a corresponding pin (in particular a pin differing from the pin 3*a* to be tested) of the top semiconductor device 1*a* (and then being stored in the above-mentioned memory cell of the top semiconductor device 1*a*)—cf. also step I, FIG. 4.

Subsequently, the bottom semiconductor device 1*b* (or alternatively—if this was addressed first in step I—the top semiconductor device 1*a*) is addressed by the testing apparatus 6.

This may, for instance, be effected by a chip select signal CS2 being output via a further line 7*b* (here: a further chip select line) connected with the testing apparatus 6, and being transferred via a corresponding line on the device module 2 connected with the line 7*b*, and a corresponding module pad to the above-mentioned chip select pin of the bottom semiconductor device 1*b*.

Subsequently—again caused by the testing apparatus 6—a corresponding, in particular digital value (e.g. "0" (or alternatively "1")) is written into a corresponding memory cell provided in the bottom semiconductor device 1*b*. This value differs from the value written into the memory cell of the top semiconductor device 1*a* in step I and is in particular inverse or contrary thereto, respectively.

For writing the corresponding value, a corresponding, for instance, logically low signal (or alternatively: a logically high signal (WRITE DATA signal)) is output e.g. via the data write line 7*c* (or a further, not illustrated line) connected with the testing apparatus 6, and is transferred via the above-mentioned line (or a further line) on the device module 2 connected with the line 7*c*, and a corresponding module pad to a corresponding pin (in particular a pin differing from the pin 3*b* to be tested) of the bottom semiconductor device 1*b* (and is then stored in the above-mentioned memory cell of the bottom semiconductor device 1*b*)—cf. also step II, FIG. 4.

Alternatively, as is, for instance, also illustrated in FIG. 5, the memory cells of the respective top and the respective bottom semiconductor devices 1*a*, 1*b* may e.g. also be supplied with the above-mentioned inverse or contrary values, respectively, substantially simultaneously (here: at a time $t_0$ with respect to a clock signal)—or overlapping in time—, e.g. the memory cell of the top semiconductor device 1*a* by means of the "logically high" data write signal "WRITE DATA 1" illustrated in FIG. 5, and the memory cell of the bottom semiconductor device 1*b* by means of the "logically low" data write signal "WRITE DATA 0" also illustrated in FIG. 5 (or vice versa).

For testing the contacting of individual pins of the top and the bottom semiconductor devices 1*a*, 1*b* that are connected with one another (here e.g. of the individual pin 3*a* of the top semiconductor device 1*a* and of the individual pin 3*b* of the bottom semiconductor device positioned below the individual pin 3*a* of the top semiconductor device), in a next step (cf. step III, FIG. 4) the values that have been stored before in steps I or II, respectively, in the two corresponding semiconductor devices 1*a*, 1*b* (or in the above-mentioned memory cells, respectively) are read out simultaneously (here: at a time $t_1$, cf. FIG. 6), namely via the individual pins 3*a*, 3*b* of the top and the bottom semiconductor devices 1*a*, 1*b* that are to be tested and that are connected with one another.

To this end—again referring to FIG. 3—the testing apparatus 6 simultaneously (or immediately successively) addresses the bottom semiconductor device 1*b* and the top semiconductor device 1*a*.

This may, for instance, be effected by a chip select signal CS1 being output via the first line 7*a* (first chip select line) connected with the testing apparatus 6 and—simultaneously (or alternatively shortly before or shortly afterwards)—a chip select signal CS2 being output via the above-mentioned further line 7b (further chip select line).

The chip select signal CS1 is, as described above, transferred via the line on the device module 2 connected with the line 7a, and the corresponding module pad to the above-mentioned chip select pin of the top semiconductor device 1a, and the chip select signal CS2—also as described above—via the line on the device module 2 connected with the line 7b, and the corresponding module pad to the above-mentioned chip select pin of the bottom semiconductor device 1b.

Subsequently—in a correspondingly conventional manner, and caused by the testing apparatus 6—the value stored in the above-mentioned memory cell of the top semiconductor device 1a (here e.g. a "logically high" value) is read out and is output at the individual pin 3a by the driver device connected to the individual pin 3a of the top semiconductor device 1a to be tested (cf. e.g. also the "logically high" signal READ DATA 1 output at the individual pin 3a and illustrated in FIG. 6).

Simultaneously (or shortly before or shortly afterwards, respectively)—also in a correspondingly conventional manner, and caused by the testing apparatus 6—the value stored in the above-mentioned memory cell of the bottom semiconductor device 1b (here e.g. a "logically low" value) is read out and is output at the individual pin 3b by the driver device connected with the individual pin 3b of the bottom semiconductor device 1b to be tested (cf. e.g. also the "logically low" signal READ DATA 0 output at the individual pin 3b and illustrated in FIG. 6).

The driver devices drive the corresponding signals (here: the "logically low" signal READ DATA 0, and the "logically high" signal READ DATA 1) at substantially equal power.

Each driver device may, for instance, comprise a pull-up and a pull-down circuit connected in series.

The pull-up circuit is e.g. connected to the supply voltage, and the pull-down circuit is e.g. connected to the ground.

For outputting a "logically high" value or a "logic One", respectively, the pull-up circuit may be switched on, i.e. be put in a conductive state, and the pull-down circuit may be switched off, i.e. be put in a locked state—then, a "logically high" output signal will be output at an output pad interposed between the pull-up and the pull-down circuits and connected to the respective individual pins 3a or 3b, respectively.

Correspondingly, for outputting a "logically low" value or a "logic 0", respectively, the pull-up circuit is switched off, i.e. put in a locked state, and the pull-down circuit is switched on, i.e. put in a conductive state, so that, correspondingly, a "logically low" output signal is output at the output pad connected to the respective individual pins 3a or 3b, respectively.

The pull-up and the pull-down circuits may e.g. each comprise one or a plurality of transistors connected in parallel (e.g. the pull-up circuit one or a plurality of p-channel MOSFETs and the pull-down circuit one or a plurality of n-channel MOSFETs).

The pull-up circuit and the pull-down circuit are designed such that the pull-up circuit has a (relatively high) impedance in the respective switched-off state, the impedance being substantially as high as the impedance of the pull-down circuit also in the switched-off state. Correspondingly, the pull-up circuit and the pull-down circuit are further designed such that the pull-up circuit has a (relatively low) impedance in the switched-on state, the impedance—also—being substantially as high as the impedance of the pull-down circuit also in the switched-on state. This also applies with respect to the pull-up and the pull-down circuits of respectively different semiconductor devices arranged on the device module, in particular with respect to the pull-up and pull-down circuits of semiconductor devices positioned one upon the other or one below the other, respectively.

When—as explained above—the driver device connected with the individual pin 3a of the top semiconductor device 1a to be tested outputs a "logically high" signal (READ DATA 1) at the individual pin 3a in step III, and the driver device connected with the individual pin 3b of the bottom semiconductor device 1b to be tested simultaneously outputs a "logically low" signal (READ DATA 0) at the individual pin 3b, there will—with sufficiently good contact between the corresponding top and bottom individual pins 3a, 3b and the pad 4a connected therewith—a signal ("test result signal") be available at the line of the device module 2 connected with the pad 4a, the level $U_x$ of which lies—due to the above-mentioned symmetrical characteristics of the pull-up and pull-down circuits of the corresponding driver devices—approximately in the middle between the "logically high" signal level $U_1$ of the signal READ DATA 1 corresponding to a "logic 1" and the "logically low" signal level $U_0$ of the signal READ DATA 0 corresponding to a "logic 0" (cf. also the signal level $U_x$ of the test result signal for the case of sufficiently good contacting illustrated in FIG. 6).

When, contrary to this, a sufficiently good electrical contact exists e.g. between the individual pin 3b of the bottom semiconductor device 1b and the corresponding pad 4a, not, however, between the individual pin 3a of the top semiconductor device 1a and the corresponding pad 4a, and when, as explained above, a "logically high" signal (READ DATA 1) is output at the individual pin 3a by the driver device connected with the individual pin 3a of the top semiconductor device 1a to be tested, and simultaneously a "logically low" signal (READ DATA 0) is output at the individual pin 3b by the driver device connected with the individual pin 3b of the bottom semiconductor device 1b to be tested, a signal ("test result signal") will be available at the line of the device module 2 connected with the pad 4a, the level $U_{X,fail,0}$ of which lies—due to the insufficient contacting between the top individual pin 3a and the pad 4a—distinctly below the middle of between the "logically high" signal level $U_1$ of the signal READ DATA 1 and the "logically low" signal level $U_0$ of the signal READ DATA 0 (cf. also the signal level $U_{X,fail,0}$ of the test result signal for the case of faulty contacting by the top semiconductor device 1a or its individual pin 3a, respectively, illustrated in FIG. 7). The reason for this is that a relatively high voltage drops at the—poor —contact between the top individual pin 3a and the pad 4a.

When, instead, vice versa a sufficiently good electrical contact exists e.g. between the individual pin 3a of the top semiconductor device 1a and the corresponding pad 4a, not, however, e.g. between the individual pin 3b of the bottom semiconductor device 1b and the corresponding pad 4a, and a "logically high" signal (READ DATA 1) is again output, as explained above, at the individual pin 3a by the driver device connected with the individual pin 3a of the top semiconductor device 1a to be tested, and a "logically low" signal (READ DATA 0) is simultaneously output at the individual pin 3b by the driver device connected with the individual pin 3b of the bottom semiconductor device 1b to be tested, a signal ("test result signal") will be available at the line of the device module 2 connected with the pad 4a, the level $U_{X,fail,1}$ of which lies—due to the insufficient contacting between the bottom individual pin 3b and the pad 4a—distinctly above the middle of between the "logically high" signal level $U_1$ of the signal READ DATA 1 and the "logically low" signal level $U_0$ of the signal READ DATA 0 (cf. also the signal level $U_{X,fail,1}$ of the test result signal for the case of faulty contacting by the bottom semiconductor device 1b or its individual pin 3b, respectively, illustrated in FIG. 8). The reason for this is that a relatively high voltage drops at the—poor—contact between the bottom individual pin 3b and the pad 4a.

The corresponding test result signal (i.e. the signal resulting altogether due to the (inverse) driving of the individual pins 3a and 3b) is, in accordance with FIG. 3, transferred to the testing apparatus 6 via a data read line 7d that is connected with the line connected to the pad 4a (signal "READ DATA") and is evaluated there, i.e. is measured, and is compared with tolerance values $U_x+\Delta$ und $U_x-\Delta$ that have been stored in the testing apparatus 6 before.

When the signal level U of the test result signal (or of the signal "READ DATA", respectively)—or the signal voltage level U measured at the data read line 7d—substantially corresponds to the level or the signal voltage level $U_x$ in the middle between the "logically high" signal level $U_1$ and the "logically low" signal level $U_0$ (or between the corresponding signal voltage levels, respectively)—or when the signal level U lies within a tolerance range between the level or the signal voltage level $U_x+\Delta$ and the level or the signal voltage level $U_x-\Delta$ illustrated in hatchings in FIG. 9, the testing apparatus 6 detects that both the individual pin 3a of the top semiconductor device 1a and the corresponding individual pin 3b of the bottom semiconductor device 1b are contacting the corresponding pad 4a sufficiently well.

The above-mentioned tolerance range ($U_x\pm\Delta$) is dimensioned such that e.g. minor manufacturing inaccuracies such as differences in the driver powers of the above-mentioned driver devices caused by production, or slight differences in the impedances of the pull-up and pull-down circuits, etc. will not—inadvertently—cause an error message.

When the signal level or the signal voltage level U of the test result signal "READ DATA" is lower than the bottom tolerance level or the bottom tolerance voltage level $U_x-\Delta$, the testing apparatus 6 detects that the individual pin 3a of the top semiconductor device 1a is not contacting the corresponding pad 4a sufficiently well.

Correspondingly, when the signal level or the signal voltage level U of the test result signal "READ DATA" is higher than the top tolerance level or the top tolerance voltage level $U_x+\Delta$, the testing apparatus 6 detects that the individual pin 3b of the bottom semiconductor device 1b is not contacting the corresponding pad 4a sufficiently well.

By means of the amount of deviation from the top (or bottom) tolerance level or from the top (or bottom) tolerance voltage level $U_x+\Delta$ (or $U_x-\Delta$), the quality of the corresponding contact can be determined: The greater the distance between the signal level U of the test result signal "READ DATA" and the top (or bottom) tolerance level $U_x+\Delta$ (or $U_x-\Delta$), the worse will be the quality of the contact between the bottom individual pin 3b (or the top individual pin 3a, respectively) and the corresponding pad 4a.

In order to exclude that both the top and the bottom individual pins 3a, 3b have a correspondingly similar insufficiently good contact with the pad 4a (which might—erroneously—result in a signal level U of the test result signal "READ DATA" lying within the tolerance range ($U_x\pm\Delta$)), a conventional contact test may be performed in an additional step (e.g. before or after the above-explained testing steps (cf. also the testing steps I, II, III, and IV illustrated in FIG. 4).

In the top and in the bottom semiconductor devices 1a, 1b—as is usual with semiconductor devices 1a, 1b—the respective individual pins 3a, 3b are connected, internally in the devices 1a, 1b (additionally to the above-mentioned driver devices) to one or a plurality of overload protection devices each containing one or a plurality of diodes (e.g. an ESD structure comprising one or a plurality of diodes each being connected to the supply voltage and/or the ground).

For performing the above-mentioned additional testing step, the testing apparatus 6 imposes, via the corresponding pad 4a that is connected with the individual pins 3a, 3b to be tested, a current upon the corresponding individual pins 3a, 3b, and thus also to the protection diodes connected therewith, and subsequently the voltage dropping across the protection diodes (connected in parallel) is measured—or the testing apparatus 6 applies a corresponding voltage at the corresponding pad 4a, whereafter the current flowing through the protection diodes is measured, respectively.

When no or only very little current is flowing, it is detected that both the top and the bottom individual pins 3a, 3b do not have any contact or have insufficiently good contact with the pad 4, respectively.

In an alternative embodiment, the above-explained method (or a method corresponding to this method) is used additionally for testing the internal lines in the semiconductor devices 1a, 1b positioned one upon the other or one below the other, respectively (in particular for testing the internal address and/or data lines).

To this end—in the above-mentioned steps I and II (cf. FIG. 4)—the corresponding, inverse or contrary digital values "0" or "1" each are not just written into one single memory cell provided on the corresponding semiconductor device 1a, 1b (or into memory cells assigned to one single address, respectively), but—advantageously simultaneously—into a plurality of, in particular more than 1, 4, 16, 64, or 256 memory cells assigned to different addresses, or, particularly advantageously, into memory cells of the entire address space of the respective semiconductor device 1a, 1b (then, e.g. a "logically high" value is stored in the entire address space of the top semiconductor device 1a, and a "logically low" value is stored in the entire address space of the bottom semiconductor device 1b (or vice versa)).

Subsequently (like with the above-mentioned steps III and IV) the (contrary or inverse) values in the bottom and top semiconductor devices 1a, 1b that have been stored under a particular, first address are simultaneously read out via the above-mentioned assigned individual pins 3a, 3b positioned one upon the other, and—as described above—the resulting test result signal READ DATA is evaluated in the testing apparatus 6.

Next (again like with the above-mentioned testing steps III and IV), the (contrary or inverse) values in the bottom and top semiconductor devices 1a, 1b that have been stored under a further, second address are simultaneously read out via the above-mentioned assigned individual pins 3a, 3b positioned one upon the other, and—as described above—the resulting test result signal READ DATA is evaluated in the testing apparatus 6 (step V).

This method is successively repeated for the entire address space in which the above-mentioned (contrary or inverse reference) values were stored in the corresponding top or bottom semiconductor devices 1a, 1b (step VI).

This way, the internal lines in the semiconductor devices 1a, 1b positioned one upon the other can additionally be tested and/or the test result determined with the above-mentioned contact test (cf. steps I to IV of FIG. 4) can be verified in the subsequent testing steps V, VI.

What is claimed is:

1. A method for testing contacting of a first and a second semiconductor device, at least one pin of the first semiconductor device is conductively connected with a connection of a device module, and at least one pin of the second semiconductor device is also conductively connected with the connection of the device module, the method comprising:

writing a first value into a memory cell of said first semiconductor device;

writing a second value differing from said first value into a memory cell of said second semiconductor device;

simultaneously outputting of a first signal corresponding to said first value at said at least one pin of said first semiconductor device and a second signal corresponding to said second value said second semiconductor device; and evaluating a signal present at the connection of the device module resulting from the first and the second signal.

2. The method according to claim 1, wherein the first and the second values are complementary digital values.

3. The method according to claim 1, further comprising evaluating a signal available at the pad.

4. The method according to claim 3, further comprising detecting a contacting fault when a level of the signal available at the pad lies below a first predetermined level.

5. The method according to claim 4, further comprising detecting a contacting fault when a level of the signal available at the pad lies above a second predetermined level, wherein the level differs from the first predetermined level.

6. The method according to claim 5, wherein the first predetermined level is lower than the second predetermined level.

7. The method according to claim 4, wherein the predetermined levels are substantially identical to a level in a middle between the levels of the signals output at the pin of the first semiconductor device and at the pin of the second semiconductor device.

8. The method according to claim 4, wherein the predetermined levels are substantially identical to a level in a middle between the levels of the signal output at the pin of the first semiconductor device and the pin of the second semiconductor device.

9. The method according to claim 1, further comprising:

writing a second value into another memory cell of the first semiconductor device;

writing a third value into another memory cell of the second semiconductor device;

jointly outputting of a signal corresponding to the value written into the another memory cell at the pin of the first semiconductor device, and a signal corresponding to the value written into the further memory cell at the pin of the second semiconductor device.

10. The method according to claim 9, wherein the memory cell of the first semiconductor device into which the first value has been written is assigned to a different address than the further memory cell of the first semiconductor device, and/or wherein the memory cell of the second semiconductor device into which the second value has been written is assigned to a different address than the further memory cell of the second semiconductor device.

11. A semiconductor device testing system comprising a testing apparatus wherein the testing apparatus sends corresponding signals to at least two semiconductor devices connected to a device module, the signals causing a first value to be written into a memory cell of a first semiconductor device and a second value, differing from the first value, to be written into a memory cell of a second semiconductor device, and the testing apparatus outputs a further signal that causes a signal corresponding to the first value to be output at a pin of the first semiconductor device and simultaneously a signal corresponding to the second value to be output at a pin of the second semiconductor device to test whether the pin of the first semiconductor device and the pin of the second semiconductor device are conductively connected with a pad of the device module.

12. The testing apparatus according to claim 11, wherein the device module is tested.

* * * * *

UNITED STATES PATENT AND TRADEMARK OFFICE
CERTIFICATE OF CORRECTION

PATENT NO.          : 7,251,758 B2                                              Page 1 of 1
APPLICATION NO. : 10/738118
DATED               : July 31, 2007
INVENTOR(S)         : Christian Stocken and Manfred Dobler It is certified that error appears in the above-identified patent and that said Letters Patent is hereby corrected as shown below:

Column 11, line 16; delete "value said"; and" insert --value at said at least one pin of said--

Signed and Sealed this

Sixth Day of November, 2007

JON W. DUDAS
*Director of the United States Patent and Trademark Office*